United States Patent
Cheng et al.

(10) Patent No.: US 12,137,534 B2
(45) Date of Patent: Nov. 5, 2024

(54) FAN CONTROLLER FOR FANS OF A MULTI-NODE COMPUTER SYSTEM

(71) Applicant: Quanta Computer Inc., Taoyuan (TW)

(72) Inventors: Hsien-Yang Cheng, Taoyuan (TW); Ying-Che Chang, Taoyuan (TW); Yi-An Chen, Taoyuan (TW); Yu-Tang Zeng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 663 days.

(21) Appl. No.: 17/349,715

(22) Filed: Jun. 16, 2021

(65) Prior Publication Data

US 2022/0408590 A1 Dec. 22, 2022

(51) Int. Cl.
*H05K 7/20* (2006.01)
*G06F 1/20* (2006.01)

(52) U.S. Cl.
CPC .......... *H05K 7/20209* (2013.01); *G06F 1/20* (2013.01); *H05K 7/20136* (2013.01)

(58) Field of Classification Search
CPC .......... H05K 7/20209; H05K 7/20136; H05K 7/20727; G06F 1/20; G06F 1/183; G06F 13/4081; G06F 13/4282; G06F 2213/0016; Y02D 10/00
See application file for complete search history.

(56) References Cited

U.S. PATENT DOCUMENTS

| | | | |
|---|---|---|---|
| 10,568,238 B1 * | 2/2020 | Leung | H05K 7/20736 |
| 2005/0210896 A1 * | 9/2005 | Durant | G06F 1/206 |
| | | | 62/178 |
| 2013/0073110 A1 * | 3/2013 | Johnson | G06F 11/3466 |
| | | | 700/299 |
| 2014/0277750 A1 * | 9/2014 | Artman | G05B 15/02 |
| | | | 700/275 |
| 2014/0277807 A1 | 9/2014 | Mick et al. | |
| 2015/0026374 A1 * | 1/2015 | Decesaris | G06F 13/40 |
| | | | 710/110 |

(Continued)

FOREIGN PATENT DOCUMENTS

| | | |
|---|---|---|
| TW | 201328550 A | 7/2013 |
| TW | 201514382 A | 4/2015 |

(Continued)

OTHER PUBLICATIONS

TW Office Action for Application No. 110129370, mailed Jun. 2, 2022, w/ First Office Action Summary.

(Continued)

*Primary Examiner* — Phuong H Nguyen (74) *Attorney, Agent, or Firm* — NIXON PEABODY LLP (57) ABSTRACT

A hardware-based fan controller for controlling fan modules in a computer system having multiple computer nodes is disclosed. Each of the computer nodes has a service processor. The fan controller includes a slave module that receives fan speed commands from each of the service processors. A fan speed generator is coupled to the slave module and a subset of the fan modules. The fan speed generator receives fan speed commands from the slave module and fan speed outputs from the subset of fan modules. The fan speed generator is configured to output a speed command to each of the fan modules in the subset.

20 Claims, 7 Drawing Sheets

(56) References Cited

U.S. PATENT DOCUMENTS

2015/0105010 A1     4/2015  Zou
2021/0092868 A1*    3/2021  Chen ........................ G06F 1/20

FOREIGN PATENT DOCUMENTS

| TW | 201520744 A | 6/2015 |
| TW | 201737785 A | 10/2017 |
| TW | 201816276 A | 5/2018 |
| TW | 201905633 A | 2/2019 |
| TW | 202037004 A | 10/2020 |

OTHER PUBLICATIONS

TW Search Report for Application No. 110129370, mailed Jun. 2, 2022, w/ First Office Action.

* cited by examiner

FAN CONTROLLER FOR FANS OF A MULTI-NODE COMPUTER SYSTEM

TECHNICAL FIELD

The present disclosure relates generally to systems and methods for optimizing thermal performance in computer systems. More particularly, aspects of this disclosure relate to a dedicated hardware controller to control fans in fan groups for a multi-node system.

BACKGROUND

Computer systems (e.g., desktop computers, blade servers, rack-mount servers, etc.) are employed in large numbers in various applications. High-demand applications, such as network based systems, data centers, or high-density finite element simulations, can stretch operational limits of hardware of a computing system, causing excess heat to be generated during operation. For example, a hard drive of a server, memory modules installed in the server, and processors of the server, etc., operating at high capacity can generate excess heat. Heat generated by individual components is generally dissipated to avoid damage or performance degradation of the individual components. For example, excessive heat can melt interconnects of fragile electronics or can damage substrates of these electronics.

In a typical multiple-server chassis arrangement of a computer system, multiple server units in the form of sleds may be inserted. Each of the sleds is essentially an independent server node having processors, memory devices, and other components. Each server node also includes a service processor such as a baseboard management controller (BMC) that monitors the physical state of the sled such as power and cooling. A separate controller for the entire chassis, a chassis management controller (CMC), is responsible for functions such as power and thermal management of the entire chassis. Groups of fans in the chassis are aligned with each of the nodes and thus are controlled by the respective node BMC to provide the required cooling. One or more BMCs report a requested fan speed to the CMC and the CMC sets the speeds of one or more fans to provide the requested cooling. However, the number of messages that pass between the CMC and the BMCs for purposes of thermal management can become excessive, cutting down the overall bandwidth available for other messages. Further, since a CMC is typically a general processor, it must be programmed by firmware and thus may not have sufficient processing speed to adequately handle all requests from the BMCs in a multi-node chassis.

Figure 1A:
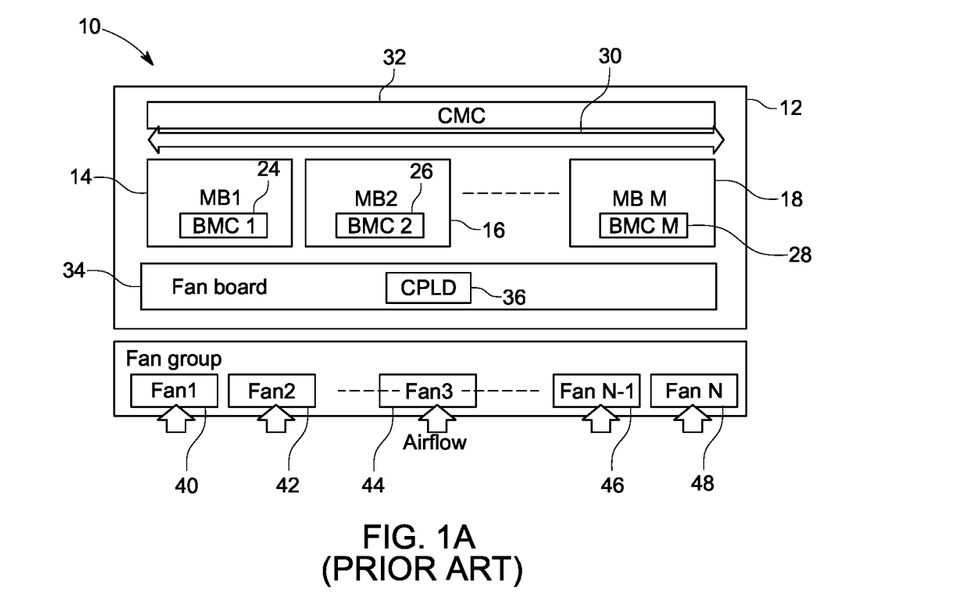
FIG. 1A is block diagram of a prior art fan control for a chassis for multiple computing nodes.

FIG. 1A shows a prior art computer system 10 having a multi-node chassis 12. The chassis 12 is a physical structure that includes registration features allowing the insertion of various sleds with separate computer components. In this example, the chassis 12 has a series of nodes 14, 16, and 18 that each have a main circuit board supported by a sled with components such as processors, storage devices, network interface cards, and the like. Each of the nodes 14, 16, and 18 has a BMC such as BMCs 24, 26, and 28. The BMCs 24, 26, and 28 are coupled to an Inter-Integrated Circuit (I2C) bus 30. The chassis 12 also includes a chassis management controller (CMC) 32 that receives fan control instructions from the BMCs 24, 26, and 28 through the I2C bus 30.

The chassis 12 also has a fan board 34 that includes a complex programmable logic device (CPLD) 36 for sending command signals to fans on the chassis 12. The CPLD 36 is also coupled to the I2C bus 30 and receives fan speed instructions from the CMC 32. The CPLD 36 controls the fan speed for a series of fans 40, 42, 44, 46, and 48. In this example, certain fans such as fans 40 and 42, are physically aligned with the node 14 to primarily cool the components of the node 14. The fans 40-48 are controlled by modulating the frequency of a pulse width modulation (PWM) signal generated by the CPLD 36. The fans 40, 42, 44, 46 and 48 each send a speed signal to the CPLD 36 that reflects the actual speed of the fan in revolutions per minute (RPM). The CMC 32 monitors the actual speed of each of the fans 40, 42, 44, 46 and 48 from the RPM data received from the CPLD 36.

Each of the BMCs 24, 26, and 28 provides a PWM value to the CMC 32 based on the desired cooling of the respective nodes 14, 16, and 18. One issue is thermal inefficiency as only some of the fans may provide a higher cooling level in response to one of the BMCs requesting a higher fan speed. The remaining fans are kept at a lower rotation speed as the CPLD 36 only changes some of the fans in response to a single PWM command from one of the BMCs.

For example, when the node 14 is overheated, the corresponding BMC 24 will send a command to increase the speed of the fans 40 and 42 to help dissipate heat in the node 14. If the node 16 is not overheated, it will maintain the same speed for the fan 44 and thus the fan 44 will have a different speed than the fans 40 and 42. Because the speeds of the fans 40 and 42 are higher, the air flow will be concentrated in the node 14, causing the temperature to rise in neighboring nodes such as the node 16. This imbalance of airflow may compromise the operation of other nodes such as the node 16.

Figure 1B:
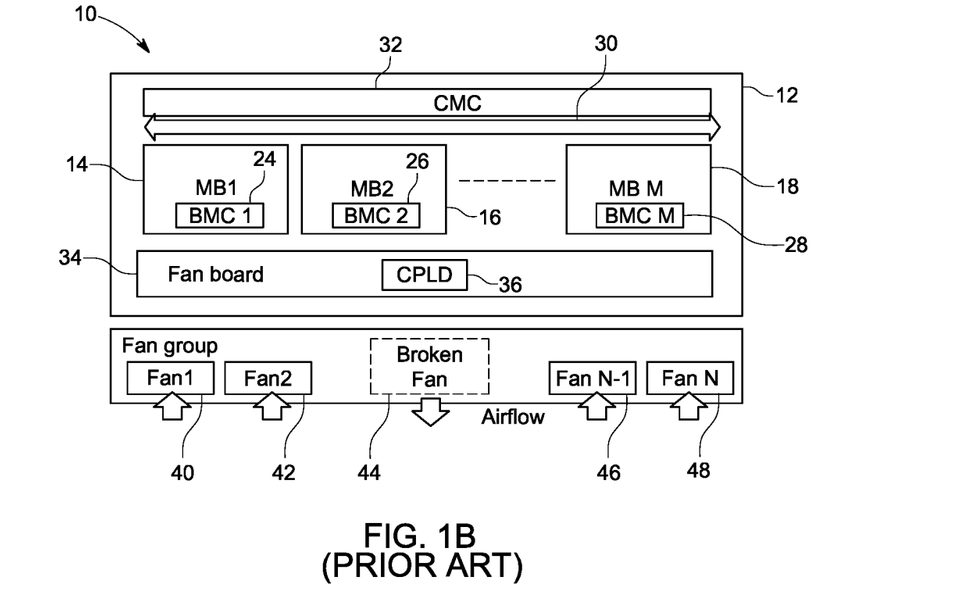
FIG. 1B is block diagram of a prior art fan control for a chassis for multiple computing nodes showing a fan failure scenario.

Hot-swapping fans is another important issue in denser fan configurations. As maximizing operational time is important, it is desirable that the nodes continue to operate while a malfunctioning fan is replaced. This hot swapping process allows the nodes to continue to operate while a specific fan is removed and replaced. FIG. 1B shows the prior art computer system 10, when the fan 44 is not functioning and needs to be swapped out. When a fan stops operating, such as the fan 44, the fan speed of all other functional fans of the chassis 12 is increased to the maximum to compensate for the reduced airflow to prevent overheating of whole system. When the fan 44 is replaced, strong airflow generated from the functional fans 40, 42, 46 and 48 causes a strong reversed airflow in the location of the fan 44 during the swap process. The strong reversed airflow caused by the other fans, may prevent the motor of the hot-swapped fan from starting, thus prevent operation of the hot-swap fan.

Thus, among other needs, there is a need for a dedicated hardware-based fan controller to control fan operation in a multi-node chassis to reduce traffic between BMCs and a CMC. There is a further need for a dedicated hardware-based fan controller that optimizes cooling between multiple nodes. There is a further need for a fan controller that minimizes reverse flow during a hot-swap of a fan to allow the hot-swapped fan to begin operation.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a hardware-based fan controller for controlling a plurality of fan modules in a computer system including a plurality of computer nodes is disclosed. Each of the computer nodes has a service processor. A slave module receives fan speed commands from each of the service processors. A fan speed generator is coupled to the slave module and to a subset of the plurality of fan modules. The fan speed generator receives fan speed commands from the slave module and fan speed outputs from the subset of fan modules. The fan speed generator is configured to output a fan speed to each of the subset of fan modules.

A further implementation of the example controller is an embodiment where the service processor is a baseboard management controller. Another implementation is where the computer system includes a chassis management controller coupled to the baseboard management controllers via a system bus. Another implementation is where the hardware-based fan controller is one of a complex programmable logic device (CPLD), an application specific integrated circuit (ASIC), or a field programmable gate array (FPGA). Another implementation is where the fan speed generator is configured in a normal mode that determines the fan speed of the subset of fan modules from the fan speed commands received from each of the plurality of service processors. Another implementation is where the fan speed generator is configured in a hot-swap mode that determines the fan speed for each of the subset of fan modules based on the fan speed outputs received from each of the subset of fan modules. Another implementation is where at least one of the subset of fan modules is set to a predetermined speed to avoid reverse air flow through another one of the subset of fan modules. Another implementation is where the fan speed generator is further configured as a finite state machine to activate the hot-swap mode. Another implementation is where a first subset of the plurality of nodes corresponds to the subset of the plurality of fan modules. A second subset of the plurality of nodes corresponds to a second subset of the plurality of fan modules. The fan controller includes a second slave module receiving fan speed commands from each service processor. The fan controller includes a second fan speed generator coupled to the second slave module and the second subset of the plurality of fan modules. The second fan speed generator receives fan speed commands from the second slave module and fan speed outputs from the second subset of fan modules. The second fan speed generator is configured to output a fan speed to each of the second subset of the plurality of fan modules.

Another disclosed example is a computer system including a chassis having a plurality of fan modules. The computer system includes a dedicated hardware-based fan controller coupled to the fan modules. A system bus is coupled to the dedicated hardware-based fan controller. The computer system has a plurality of sleds each having a service processor. The service processors are coupled to the hardware-based fan controller via the system bus. The hardware-based fan controller includes a fan speed generator module configured to receive a fan speed command from each of the service processors. The fan speed generator module receives an actual fan speed signal from each fan module of a subset of the plurality of fan modules. The fan speed generator module controls a fan speed of the subset of the plurality of fan modules.

A further implementation of the example computer system is an embodiment where the service processor is a baseboard management controller. Another implementation is where the computer system includes a chassis management controller coupled to the baseboard management controller via the system bus. Another implementation is where the fan speed generator module is further configured to send the received actual fan speed signals from the subset of the plurality of fan modules to an external controller on the system bus. Another implementation is where the hardware-based fan controller is one of a complex programmable logic device (CPLD), an application specific integrated circuit (ASIC), or a field programmable gate array (FPGA). Another implementation is where the first fan speed generator module is configured in a normal mode that determines the fan speed of the subset of the plurality of fan modules from the fan speed commands received from each service processor. Another implementation is where the fan speed generator module is configured in a hot-swap mode that determines the fan speed of the subset of the plurality of fan modules based on the actual fan speed signals received from each of the subset of the plurality of fan modules. Another implementation is where at least one of the subset of the plurality of fan modules is set to a predetermined speed to avoid reverse air flow through another one of the subset of the plurality of fan modules. Another implementation is where the fan speed generator module is configured as a finite state machine to activate the hot-swap mode. Another implementation is where a first subset of the plurality of sleds corresponds to the subset of the plurality of fan modules. A second subset of the plurality of sleds corresponds to another subset of the plurality of fan modules. The dedicated hardware-based fan controller includes a second fan speed generator module coupled to the another subset of the plurality of fan modules. The second fan speed generator module receives fan speed commands and fan speed outputs from the another subset of the plurality of fan modules. The second fan speed generator module is configured to output a fan speed to each of the another subset of the plurality of fan modules.

Another disclosed example is a method of configuring a hardware controller to operate fan modules of a chassis including computer nodes each having a service processor. A plurality of bus interface modules, each corresponding to a respective service processor, is configured. At least one group of fan modules is created from the fan modules. A fan controller is configured to receive an actual speed signal from each of the group of fan modules. A fan speed command is received from each service processor. A fan speed is determined for each fan module in the group of fan modules. The fan speed for each fan module in the group of fan modules is controlled via the hardware controller.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a hardware-based fan controller such as a CPLD that controls fan speeds of fan modules for different fan groups in a multi-node chassis. The BMCs of the nodes in the chassis communicate fan speed commands directly with the hardware-based fan controller, thus freeing the chassis management controller (CMC) for other operational management tasks. The hardware-based fan controller includes two modes for setting the fan speed for all of the fan modules. A normal mode allows efficient allocation of airflow generated from the fans between all of the nodes. The normal mode routine determines the fan speed command in the form of a pulse width modulation (PWM) signal for fan modules in the same fan group based on requested fan speed commands from all BMCs. The CPLD can calculate the optimal PWM value based on the fan speed commands from the BMCs for all fans in the same group of fans. The second mode is a hot-swap mode that controls fan speeds of the fan modules in a particular fan group to avoid reverse airflow while a fan module is hot swapped out. By observing the fan speed outputs in the form of frequency generator signals (FG) converted to revolutions per minute (RPM)s of the fan modules in the fan group. Based on the RPMs of the fans in the fan group, the PWM values of fan modules in the fan group are adjusted to reduce reverse airflow through the hot-swapped fan module. This allows the hot-swapped fan to start up and ramp up to the desired speed.

Figure 2:
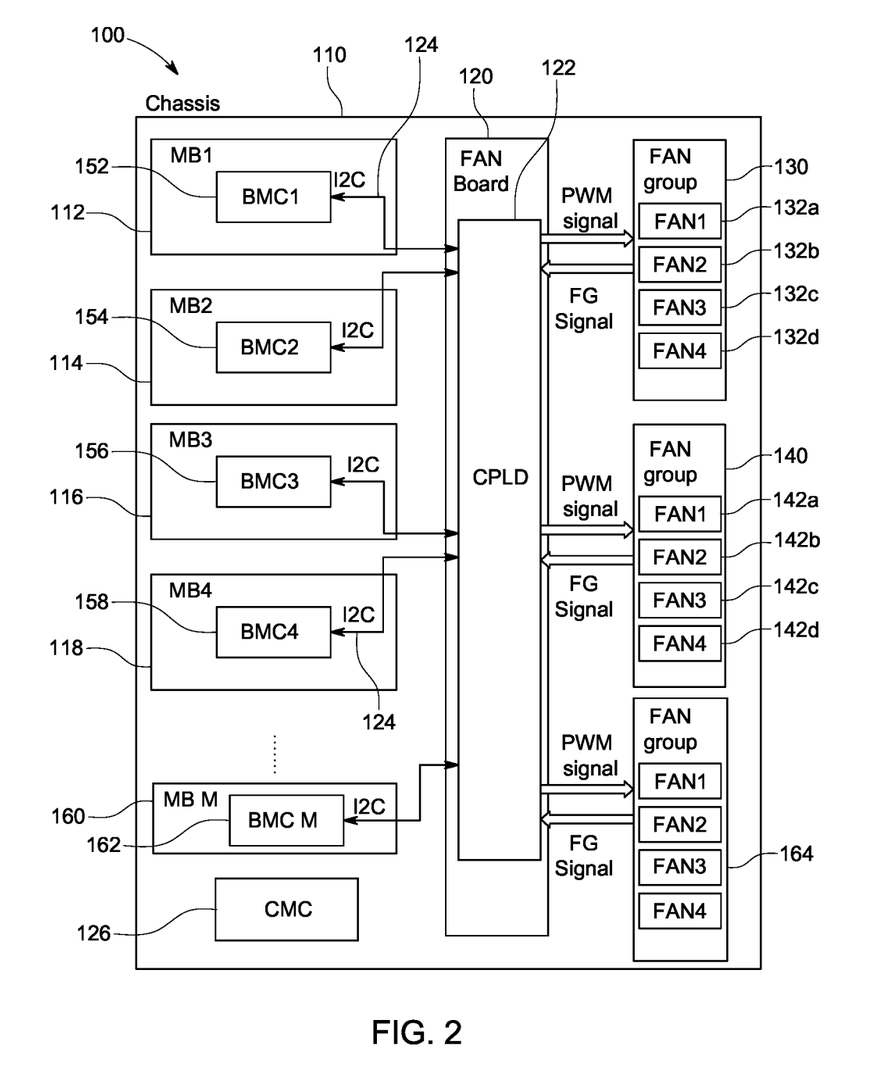
FIG. 2 is a block diagram of a computer system having a multi-node chassis. according to certain aspects of the present disclosure.

FIG. 2 is a block diagram of a computer system 100 that incorporates a hardware-based fan controller for fan speed control of fan modules. The computer system 100 includes a multi-node chassis 110 that holds multiple sleds 112, 114, 116, and 118. In this example, each of the sleds 112, 114, 116, and 118 is a server node that has separate computer processing, storage, and networking functionality that allows communication of data with other server nodes. The chassis 110 supplies power to the sleds 112, 114, 116, and 118 and manages overall operation.

The chassis 110 includes a fan board 120 that holds a hardware-based fan controller, such as a complex programmable logic device (CPLD) 122 that is configured to perform different fan management functions. The CPLD 122 may communicate with the sleds 112, 114, 116, and 118 and other controllers through a system bus such as an I2C bus 124. A chassis management controller (CMC) 126 is also coupled to the I2C bus 124. In this example, the CMC 126 is a general processor that is programmed to handle management operations, such as power management for the chassis 110.

Cooling of the sleds 112, 114, 116, and 118 is handled by fan groups 130 and 140, that each have a subset of the overall number of fan modules of the chassis 110. In this example, the fan group 130 is aligned with the sleds 112 and 114 and includes fan modules 132*a*, 132*b*, 132*c*, and 132*d*. Thus, the fan modules 132*a*, 132*b*, 132*c*, and 132*d* are primarily dedicated to cooling the sleds 112 and 114. Similarly, the fan group 140 is aligned with the sleds 116 and 118 and includes fan modules 142*a*, 142*b*, 142*c*, and 142*d*. Thus, the fan modules 142*a*, 142*b*, 142*c*, and 142*d* are primarily dedicated to cooling the sleds 116 and 118. The fan modules 132*a*, 132*b*, 132*c*, 132*d*, 142*a*, 142*b*, 142*c*, and 142*d* are identical modules in this example that may be plugged in or removed from the chassis 110 while the sleds 112, 114, 116, and 118 maintain operation. Each fan module 132*a*, 132*b*, 132*c*, 132*d*, 142*a*, 142*b*, 142*c*, and 142*d* includes an inlet rotor and an outlet rotor. Each of the rotors is rotated by a corresponding motor. The motor speeds, and therefore the rotation speeds, of the two rotors may be controlled by a pulse width modulation (PWM) signal. Each of the fan modules also includes two speed sensors that output the actual fan speed in the form of a frequency generator (FG) signal. The received FG signal is converted to the revolutions per minute (RPM) of the inlet and outlet rotors, respectively, of the fan modules by the CPLD 122.

Each sled has a separate service processor or service controller for monitoring the physical state of the sled and operational management. The service processor may be baseboard management controllers (BMCs) 152, 154, 156, and 158 for the respective sleds 112, 114, 116, and 118. Each of the BMCs 152, 154, 156, and 158 is also coupled to the I2C bus 124 to allow communication with the CPLD 122 and the CMC 126. As will be explained, the BMCs 152, 154, 156, and 158 send fan speed commands to the CPLD 122 in the form of PWM command signals through the I2C bus 124. The fan speed commands are determined by the BMC based on the required cooling for the sled. The CPLD 122 sends a fan speed value in the form of PWM signals to all the fan modules, such as the fan modules of the fan groups 130 and 140. The CPLD 122 receives an actual speed from the FG signals from all of the fan modules such as the fan modules of the fan groups 130 and 140. Although four sleds are discussed above, the CPLD 122 may be scaled for additional sleds up to a number M of sleds that may be accommodated by the chassis 110. In this example, the M sled is a sled 160, with a corresponding BMC 162. The number of sleds is also limited by the number of fan groups that may be installed on the chassis up to a last K fan group 164.

Figure 3:
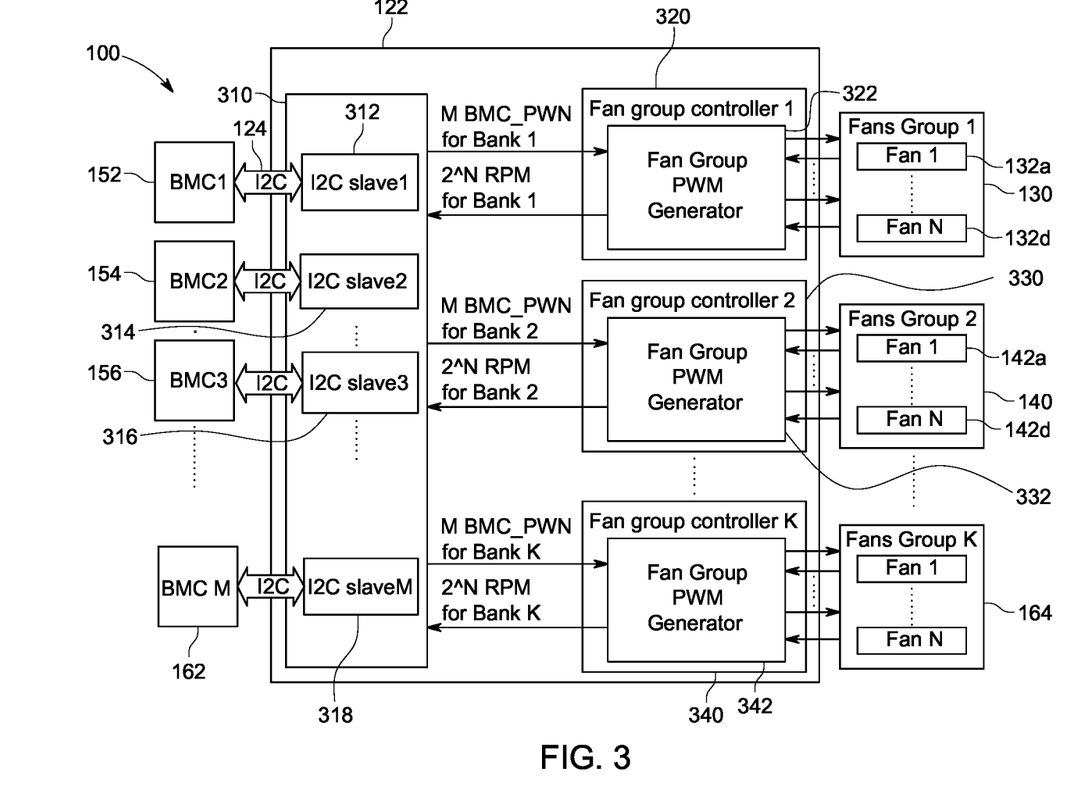
FIG. 3 is a block diagram of the example hardware-based fan controller of the computer system in FIG. 2, according to certain aspects of the present disclosure.

FIG. 3 shows a block diagram of the functional modules of the CPLD 122. The CPLD 122 is configured as an I2C interface 310 and for a number, K, of fan group controllers corresponding to the number of fan groups and computing nodes in the chassis 110 in FIG. 2. In this example, the CPLD 122 is configured at the factory for the specific hardware specifications of the chassis 110 in FIG. 2. The I2C interface 310 includes M I2C slave modules corresponding to each of the M BMCs, such as the I2C slave modules 312, 314, 316, and 318. Thus, in this example, the I2C slave module 312 receives the fan speed commands from all of the M BMCs, such as BMCs 152, 154, 156, and 162 through the I2C bus 124. Similarly, the I2C slave module 314 receives the fan speed commands from all of the M BMCs such as BMCs 152, 154, 156, and 162 through the I2C bus 124. Each of the I2C slave modules 312, 314, 316, and 318 save PWM parameters from the received fan speed commands from each of the BMCs of the chassis 110 in FIG. 2 in registers.

The CPLD 122 is also programmed to operate fan group controllers corresponding to controlling all of the fans in each of the fan groups on the chassis 110. In this example, there are K fan controllers that each control a single fan group (bank of fan modules). Each fan group provides primary cooling for two nodes. Thus, there are K fan controllers for M nodes, and therefore M is twice K. Correspondingly, the fan modules of the chassis 110 are grouped into K fan groups. However, any number of nodes may be assigned to each fan controller and corresponding fan group. In this example, a fan group controller 320 is configured to control the fan modules of the fan group 130 that provide cooling for the nodes in the sleds 112 and 114 in FIG. 2. Another fan group controller 330 is configured to control the fan modules of the fan group 140 that provide cooling for the nodes in the sleds 116 and 118 in FIG. 2. A last fan group controller 340 is configured to control the fan modules of a last fan group 164 that cools the last set of two nodes of the chassis 110.

The fan group controller 320 includes a fan speed generator for the fan group, such as a fan group PWM generator 322. The fan group controller 330 includes a fan speed generator for the fan group, such as a fan group PWM generator 332. The fan group controller 340 includes a fan group PWM generator 342. The fan group PWM generators 322, 332, and 342 output the PWM control signals that are routed to the fan modules in the respective fan groups 130, 140, and 164. The fan group PWM generators 322, 332, and 342 also receive the fan speed output FG signals from all the fan modules in their respective fan groups and convert the FG signals to an RPG value.

Generally, each of the K fan group PWM generators read the M PWM commands received by the respective I2C slave module from the M BMCs. Based on the M PWM commands from the BMCs, the fan group PWM generator calculates a single PWM signal for all fans in the respective fan group. The fans of the fan group return the FG signals to fan group PWM generator. In this example, each fan outputs an FG signal for the inlet rotor and the outlet rotor. The fan group PWM generators determine the RPMs based on the received FG signals. In normal operation the fan group PWM generator 322 reads the fan speed commands from each of the M BMCs stored in the I2C slave module 312 and determines a PWM value. The PWM value is sent to all of the fan modules 132*a*-132*d* of the fan group 130 and thus all of the fan modules 132*a*-132*d* rotate at the same speed. The K fan group PWM generators also send the PWM signals sent to each fan module to the respective slave module for storage in a register. For example, the fan group PWM generator 322 sends 2 (inlet and outlet RPMs)×the number of fan modules in the group/bank 130 for a total of 8 PRM output signals. The RPM outputs converted from the FG signals from each of the fan modules are also sent to the corresponding BMCs through the I2C bus 124. The BMCs may read the register in the respective slave module to determine whether the actual speeds of the fan modules match the expected speeds from the PWM signals.

Figure 4:
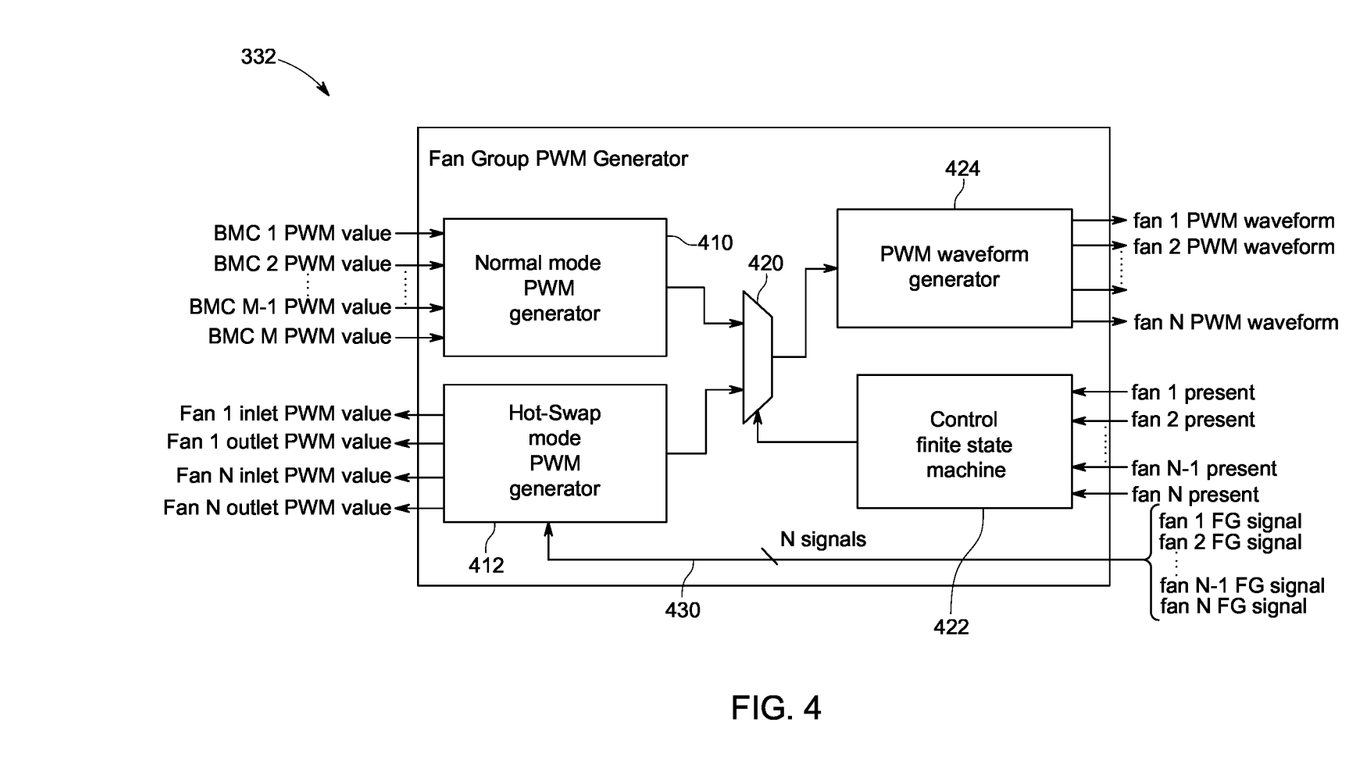
FIG. 4 is a block diagram of one of the PWM generator modules configured in the hardware-based fan controller in FIG. 3, according to certain aspects of the present disclosure.

Each of the fan group controllers 320 and 330 may have two modes, a normal mode and a hot-swap mode, for controlling the speed of the fan modules. FIG. 4 shows a block diagram for one of the fan group PWM generators such as the fan group PWM generator 322. The components of the fan group PWM generator 322 are configured from the CPLD 122 in FIG. 2. The fan group PWM generator 322 includes a normal mode PWM generator 410 and a hot-swap mode PWM generator 412. Each of the PWM generators 410 and 412 output a PWM value. The normal mode PWM generator 410 accepts the fan speed commands output by the BMCs of all of the nodes of the chassis 110 in FIG. 2 to determine the PWM value. The hot-swap mode PWM generator 412 accepts the FG signal speed outputs from the fan modules and converts the FG signals to RPMs to determine the PWM values for the fan modules of the fan group.

The outputs of the PWM generators 410 and 412 are coupled to the inputs of a multiplexer 420. The multiplexer 420 is controlled by the output of a finite state machine 422. The multiplexer 420 outputs the PWM value received from one of the inputs to a PWM waveform generator 424. The PWM waveform generator 424 generates PWM signals that are output to each of the fan modules of the fan group. The finite state machine 422 includes inputs based on signals indicating whether each the fan module in the fan group is present. For example, each of the fan modules may output a fan module present pin status signal. The finite state machine 422 will select the hot-swap mode if one of the fan modules is not present. The finite state machine 422 thus decides whether the hot-swap mode is required, based on determining when one of the fan modules of the fan group is not present. A signal bus 430 includes the FG speed output signals output from the fan modules of the fan group. The FG speed signals are carried by the signal bus 430 to the hot-swap PWM generator 412. The hot-swap PWM generator 412 will send a PWM inlet value and a PWM outlet value respectively for the inlet and outlet rotor for each of the fans that may be collected by the CMC 126, or one of the BMCs in FIG. 2 for diagnostic purposes.

In the normal mode, the normal mode PWM generator 410 reads the PWM parameters from the corresponding I2C slave modules and uses a routine to decide which PWM value is optimal for the corresponding fan group. The normal mode will generally select the maximum fan PWM value requested by the M BMCs to provide optimal cooling of the nodes from the fan modules in the fan group.

In the hot-swap mode, the hot-swap PWM generator 412 uses the received FG fan speed signals of each of the fan modules to determine the RPMs of the hot-swapped fan and other fans in the fan group. If the hot-swap mode PWM generator 412 detects an incorrect RPM for the hot-swapped fan, the PWM values of the functional fans are adjusted, so the fan speeds of the functional fans prevent reverse flow through the hot-swapped fan. This provides the hot-swapped fan a chance to generate sufficient torque to speed up to a normal operation. The nodes cooled by the fan group are may continue to operate.

Figure 5:
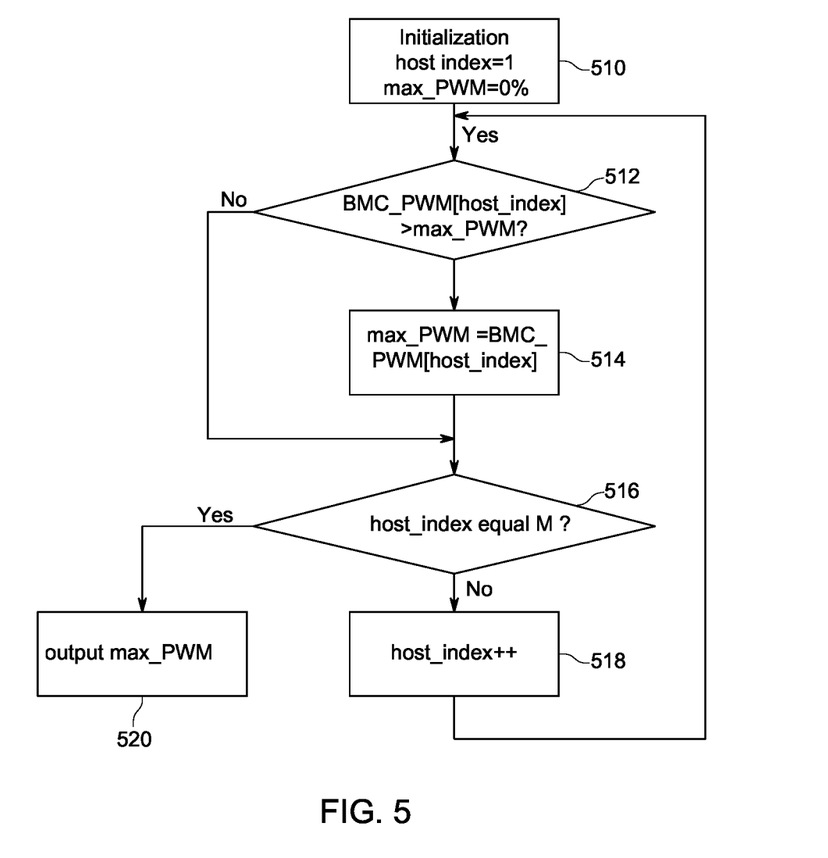
FIG. 5 is a flow diagram of the routine executed by the PWM generator module to determine fan speed based in a normal mode, according to certain aspects of the present disclosure.

FIG. 5 is a flow diagram of the normal mode routine performed by the normal mode PWM generator 410 on a periodic basis such as once every second. The normal mode PWM generator 410 uses the routine to determine the PWM value for each fan module in the fan group based on PWM commands received from all of the BMCs in FIG. 2. In this example, the BMCs of the multi-node system are designated as hosts 1 through M, where M is the last BMC. The routine first sets the host index to 1 and the maximum PWM value to 0 (510). The routine determines whether the PWM value received from the host index BMC is larger than the maximum PWM value (512). If the PWM value is larger than the maximum value, the max PWM value is set to the received PWM value (514). The index is then compared to the total number of nodes, M (516). If the PWM value is less than the maximum PWM value (514), the current maximum PWM value is maintained, and the index is compared to the total number of nodes (416). If the host index is not equal to M, the host index is incremented by one (518). The routine then loops back and compares the PWM parameter received from the new host BMC to the maximum PWM (512). If the index value is equal to the number of nodes (516), indicating that all PWM command parameters have been reviewed from all the BMCs, the routine outputs the current maximum PWM (520). The current maximum PWM is then output by the normal mode PWM generator 410 as the PWM value to the fan modules of the fan group.

Figure 6:
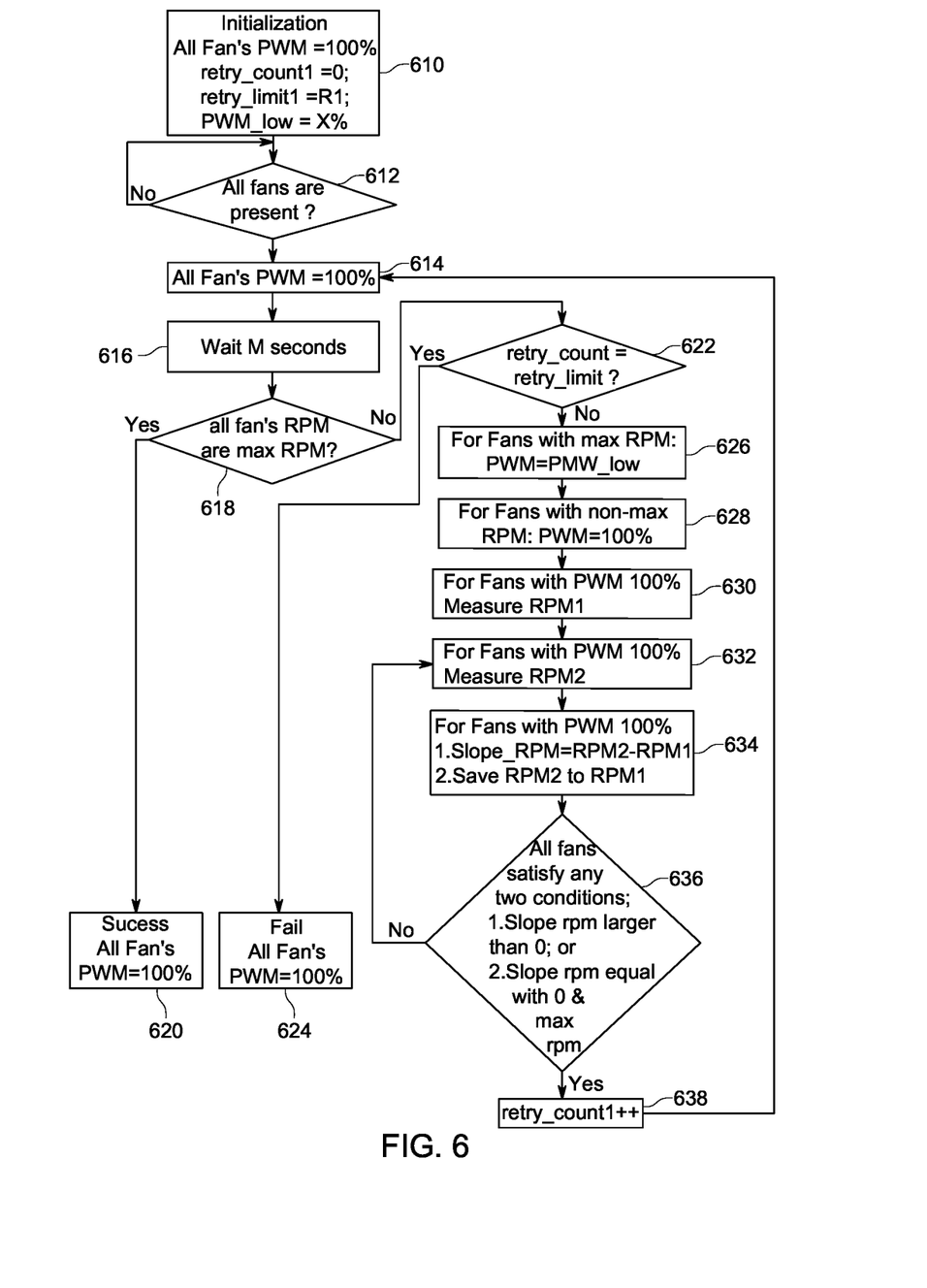
FIG. 6 is a flow diagram of a routine executed by the PWM generator to determine fan speeds for a hot-swap mode, according to certain aspects of the present disclosure.

FIG. 6 is a flow diagram of the hot-swap mode routine executed by the hot-swap PWM generator 412 in FIG. 4. The routine begins by setting initial values (610). Thus, the initial settings are all fan PWMs are at 100%, a retry count is zero, a retry limit is R1, and a PWM low value is a set percentage of the maximum PWM of the fan modules. In this example, the retry limit value, R1 may be set at 10, while the PWM low value is 25% of the PWM maximum value. The routine first determines whether all of the fan modules of the fan group are present via the finite state machine 422 in FIG. 4 (612). This indicates that a fan module has been hot-swapped in. If all of the fan modules are not present, the routine loops back to continue to determine whether all the fans are present (612). If all of the fans are present, the PWM values of the fan modules are set at 100% (614). The routine then waits a predetermined time for the fan modules in the fan group to reach full speed (616). For example, the predetermined time may be 2 seconds for the fan modules in this example, but different values for different fan modules with different times to reach full speed. The hot-swap PWM generator 412 then reads the actual fan speeds from all of the fan modules and determines whether the RPMs are at the maximum RPM for each fan module (618). If all of the fan speeds are maximum, this indicates a successful swap (620). The routine then exits the hot-swap mode via a control signal from the finite state machine 422.

If all the fan module RPMs are not at the maximum (618), the routine determines whether the retry counter is at the retry limit (622). If the retry counter is not at the retry limit (622), the routine sets the PWM of the fan modules with a maximum RPM to the PWM low value (626). The routine then sets the PWM value of the fan modules with a non-maximum RPM to the maximum PWM value (628). The routine then measures a first RPM for all fan modules that have been set at the maximum PWM value (630). The routine then measures a second RPM for all fan modules that have been set at the maximum PWM value (632). In this example, the finite state machine 422 controls the time period (e.g., 1 second) between the first and second RPM measurements. The first and second RPM values are then used to determine a slope between the first RPM value and the second RPM. The second RPM value is then set as the first RPM value (634). The routine then determines whether all of the fan modules in the fan group either: 1) have an RPM slope greater than zero (indicating some fans are not at the maximum RPM); or 2) the RPM slope is equal to zero and the first RPM value is maximum (indicating the fan modules are at the maximum RPM) (636). If any fan module of the fan group does not meet one of the two conditions (636), the routine loops back and measures the second RPM value for all fan modules at the maximum PWM (634). If one of the two conditions is satisfied for all of the fan modules in the fan group, the retry count is incremented (638), and the routine loops back to set all of the PWM values input to the fan modules to maximum (614).

If the retry counter is at the retry limit (622), the routine then indicates the failure of the hot-swap (624). The routine sets the PWM output at 100% for the other fans and turns on a fan fault LED to indicate the failure.

Figure 7:
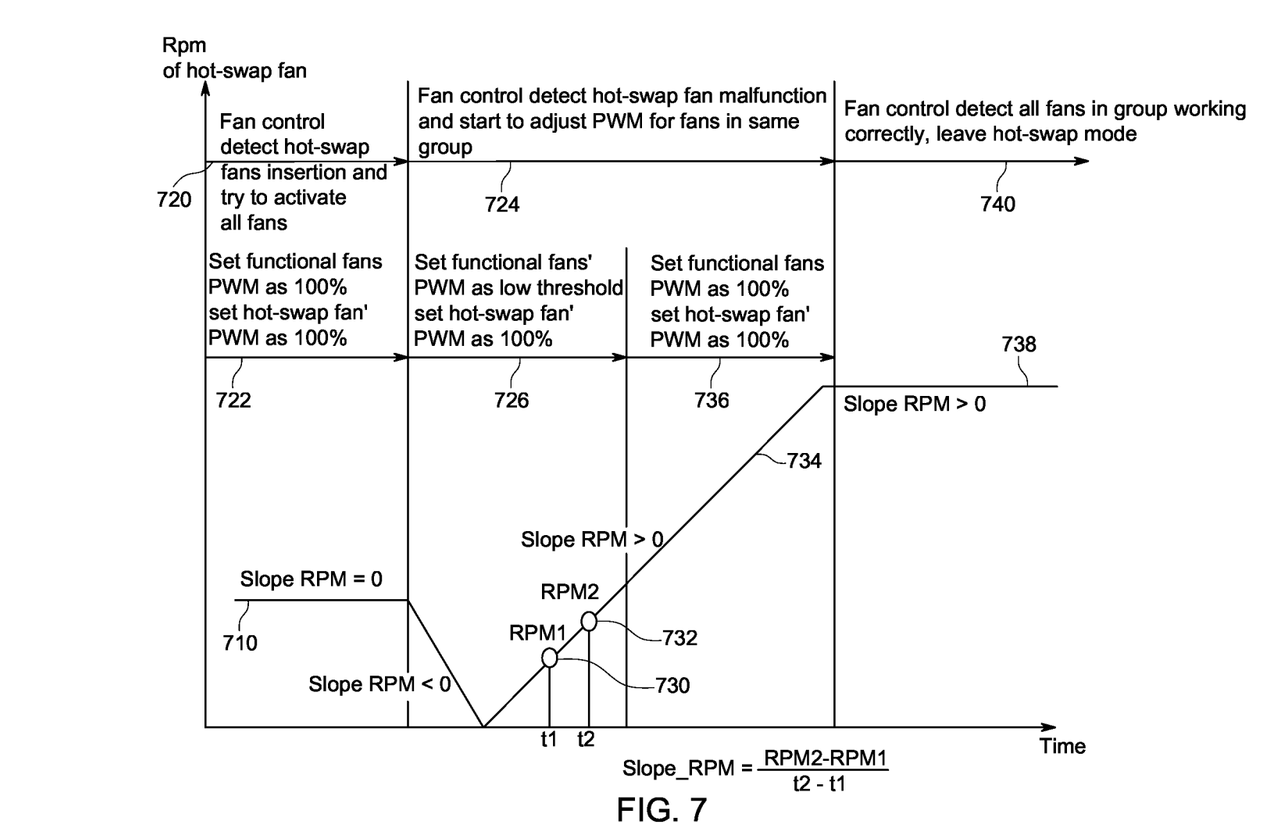
FIG. 7 is a timing diagram showing the control of fan speed for a hot-swapped fan module when the PWM generator is in the hot-swap mode, according to certain aspects of the present disclosure.

The sequence of increasing fan speed for a successfully hot-swapped fan module during the hot-swap routine while the other fans are at a reduced speed to allow the hot-swap, may be seen in a time graph in FIG. 7. FIG. 7 includes a trace 710 that shows the RPM of a hot-swapped fan of a fan group during the hot-swap routine in FIG. 6. During a first phase 720, the finite state machine 422 in FIG. 4 detects that that a fan module is being hot-swapped through reading a detect fan module present pin status signal. Still referring to FIG. 4, the finite state machine 422 switches the input of the multiplexer 420 to the PWM signal generated by the hot-swap PWM generator 412. Referring back to FIG. 7, the routine thus sets the PWM signal to the maximum PWM value for all fan modules in the fan group (722). On detection of a hot-swap fan module malfunction due to reverse air flow (724), the routine sets the functional fan modules to the low PWM value and sets the hot-swapped fan to the maximum PWM (726).

In setting the low PWM values for the other fans, reverse airflow is minimized. Thus, on receiving the maximum PWM signal, the hot-swapped fan module should be able to increase the RPM until it is at full speed if the hot-swapped fan module is functioning correctly. A first RPM is measured (730) and a second RPM is measured at a later time (732). Since the second RPM should be greater than the first RPM, the determined slope will be a positive value. As the RPM values increase (734), the routine sets the PWM value to maximum for all of the fans (736). Assuming the hot-swapped fan module is functioning normally, the slope will be zero when the RPM is maintained at the maximum (738). This indicates a successful hot-swap, and the FSM 422 will then leave the hot-swap mode and switch back to the normal mode (740).

The above described routines in FIGS. 5-6 are representative of example machine-readable instructions for the CPLD 122 in FIG. 2 to perform either in the normal mode or a hot-swap mode. In this example, the machine-readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can, alternatively, be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic device, etc.). For example, any or all of the components of the interfaces can be implemented by software, hardware, and/or firmware. Also, some or all of the machine-readable instructions represented by the flowcharts may be implemented manually. Further, although the example routine is described herein, persons of ordinary skill in the art will readily appreciate that many other methods of implementing the example machine-readable instructions may alternatively be used.

In this example, the CPLD 122 is a MachX02 manufactured by Lattice, but other suitable programmable hardware devices may be used. The programmable hardware fan controller may be a dedicated circuit device such as any suitable complex programmable logic device (CPLD), an application specific integrated circuit (ASIC), or a field programmable gate array (FPGA) that implements the fan control modes described herein. If the fan controller is a dedicated specialized circuit device, such as an ASIC, the functions are designed in the hardware itself. If the power system control circuit includes programmable hardware such as a CPLD or an FPGA, the device hardware may be programmed before installation in the computer system 100. The number of PWM generators configured in the CPLD 122 may be performed in the factory in accordance with the number of nodes and fan modules in a chassis. Alternatively, a set number of PWM generators may be configured for a variable number of fan modules and a user may select a number of the PWM generators and corresponding fan modules, according to the number of nodes and fan modules in the chassis.

The CPLD 122 is more stable relative to a general processor, such as a CMC in running the routines for fan control. The CPLD 122 also uses hardware for executing routines instead of software and provides faster response and determination of fan control signals.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A hardware-based fan controller for controlling a plurality of fan modules in a computer system including a plurality of computer nodes, each of the computer nodes having a service processor, the hardware-based fan controller comprising:
   a slave module receiving fan speed commands from each of the service processors; and
   a fan speed generator coupled to the slave module and a subset of the plurality of fan modules, the fan speed generator receiving fan speed commands from the slave module and fan speed outputs from the subset of fan modules, wherein the fan speed generator is configured in a normal mode to output a first fan speed to each of the fan modules in the subset and the fan speed generator is configurable to select a hot swap mode to output a second fan speed to each of the fan modules remaining in the subset when a fan module of the subset is detected as being removed, wherein the second fan speed is slower than the first fan speed to prevent reverse airflow through hot swapping the removed fan module.

2. The hardware-based fan controller of claim 1, wherein the service processor is a baseboard management controller.

3. The hardware-based fan controller of claim 2, wherein the computer system includes a chassis management controller coupled to the baseboard management controller via a system bus.

4. The hardware-based fan controller of claim 1, wherein the hardware-based fan controller is one of a complex programmable logic device (CPLD), an application specific integrated circuit (ASIC), or a field programmable gate array (FPGA).

5. The hardware-based fan controller of claim 1, wherein the fan speed generator is configured in the normal mode to determine the first fan speed of the subset of the plurality of fan modules from the fan speed commands received from each service processor.

6. The hardware-based fan controller of claim 1, wherein the fan speed generator is further configured as a finite state machine to select the hot-swap mode.

7. The hardware-based fan controller of claim 6, wherein the finite state machine includes inputs from each of the subset of the plurality of fan modules indicating the respective fan module is present.

8. The hardware-based fan controller of claim 1, wherein a first subset of the plurality of nodes corresponds to the subset of the plurality of fan modules, wherein the slave module is a first slave module and the fan speed generator is a first fan speed generator, wherein a second subset of the plurality of nodes corresponds to a second subset of the plurality of fan modules, and wherein the hardware-based fan controller further comprises:
 a second slave module receiving fan speed commands from each of the service processors; and
 a second fan speed generator coupled to the second slave module and the second subset of the plurality of fan modules, the second fan speed generator receiving fan speed commands from the second slave module and fan speed outputs from the second subset of the plurality of fan modules, wherein the second fan speed generator is configured to output a fan speed to each of the second subset of the plurality of fan modules.

9. The hardware-based fan controller of claim 1, wherein the fan speed generator is configured to:
 detect a hot swapped fan module replacing the removed fan module;
 output the first fan speed to the hot swapped fan module;
 determining the hot swapped fan module is at the first fan speed,
 set the fan modules remaining in the subset to the first fan speed; and
 exit the hot swap mode.

10. A computer system comprising:
 a chassis including a plurality of fan modules;
 a dedicated hardware-based fan controller coupled to the plurality of fan modules;
 a system bus coupled to the dedicated hardware-based fan controller; and
 a plurality of sleds each having a service processor, the service processor being coupled to the hardware-based fan controller via the system bus;
 wherein the dedicated hardware-based fan controller includes a fan speed generator module configured to:
  receive a fan speed command from each service processor,
  receive an actual fan speed signal from each of a subset of the plurality of fan modules, and
  control a first fan speed of the subset of the plurality of fan modules when configured in a normal mode and, select a hot swap mode to control a second fan speed of the subset of the plurality of fan modules when a fan module of the subset is detected as being removed, wherein the second fan speed is slower than the first fan speed to prevent reverse airflow through hot swapping the removed fan module.

11. The computer system of claim 10, wherein the service processor is a baseboard management controller.

12. The computer system of claim 11, further comprising a chassis management controller coupled to the baseboard management controller via the system bus.

13. The computer system of claim 10, wherein the fan speed generator module is further configured to send the received actual fan speed signal from the subset of the plurality of fan modules to an external controller on the system bus.

14. The computer system of claim 10, wherein the dedicated hardware-based fan controller is one of a complex programmable logic device (CPLD), an application specific integrated circuit (ASIC), or a field programmable gate array (FPGA).

15. The computer system of claim 10, wherein the fan speed generator module determines the first fan speed of the subset of the plurality of fan modules from the fan speed command received from each service processor.

16. The computer system of claim 10, wherein the fan speed generator module is configured as a finite state machine to select the hot-swap mode.

17. The computer system of claim 16, wherein the finite state machine includes inputs from each of the subset of the plurality of fan modules indicating the respective fan module is present.

18. The computer system of claim 10, wherein a first subset of the plurality of sleds corresponds to the subset of the plurality of fan modules, wherein a second subset of the plurality of sleds corresponds to another subset of the plurality of fan modules, wherein the fan speed generator module is a first fan speed generator module, wherein the dedicated hardware-based fan controller includes a second fan speed generator module coupled to the another subset of the plurality of fan modules, the second fan speed generator module receiving fan speed commands and fan speed outputs from the another subset of the plurality of fan modules, and wherein the second fan speed generator module is configured to output a fan speed to each of the another subset of the plurality of the fan modules.

19. The computer system of claim 10, wherein the fan speed generator is configured to:
 detect a hot swapped fan module replacing the removed fan module;
 output the first fan speed to the hot swapped fan module;
 determining the hot swapped fan module is at the first fan speed,
 set the fan modules remaining in the subset to the first fan speed; and
 exit the hot swap mode.

20. A method of configuring a hardware controller to operate a plurality of fan modules of a chassis having a plurality of computer nodes each having a service processor, the method comprising:
 configuring a plurality of bus interface modules, each corresponding to a respective service processor;
 creating at least one group of fan modules from the plurality of fan modules;
 configuring a hardware fan controller to receive an actual speed signal from each of the group of fan modules;
 receiving a fan speed command from each service processor;

determining a first fan speed for each fan module in the group of fan modules;

controlling the fan speed for each fan module in the group of fan modules via the hardware fan controller according to the determined first fan speed in a normal mode;

determining whether a fan module in the group of fan modules is removed;

outputting a second fan speed to each of the fan modules remaining in the group when a fan module of the group is determined as removed from the group, wherein the second fan speed is slower than the first fan speed to prevent reverse airflow through hot swapping the removed fan module in a hot swap mode.

\* \* \* \* \*